US009356185B2

(12) United States Patent
Rossi

(10) Patent No.: US 9,356,185 B2
(45) Date of Patent: May 31, 2016

(54) COMPACT LIGHT SENSING MODULES INCLUDING REFLECTIVE SURFACES TO ENHANCE LIGHT COLLECTION AND/OR EMISSION, AND METHODS OF FABRICATING SUCH MODULES

(71) Applicant: Heptagon Micro Optics Pte. Ltd., Singapore (SG)

(72) Inventor: Markus Rossi, Jona (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 14/739,373

(22) Filed: Jun. 15, 2015

(65) Prior Publication Data

US 2015/0372185 A1   Dec. 24, 2015

Related U.S. Application Data

(60) Provisional application No. 62/014,995, filed on Jun. 20, 2014.

(51) Int. Cl.
| | |
|---|---|
| *H01L 31/18* | (2006.01) |
| *H01L 31/0232* | (2014.01) |
| *H01L 33/00* | (2010.01) |
| *H01L 23/00* | (2006.01) |

(52) U.S. Cl.
CPC ...... *H01L 31/1876* (2013.01); *H01L 31/02327* (2013.01); *H01L 31/1892* (2013.01); *H01L 33/005* (2013.01); *H01L 24/97* (2013.01); *H01L 2933/0058* (2013.01)

(58) Field of Classification Search
None
See application file for complete search history.

(56) References Cited

U.S. PATENT DOCUMENTS

| | | | |
|---|---|---|---|
| 8,097,894 B2 | 1/2012 | Bierhuizen et al. | |
| 8,643,953 B2 | 2/2014 | Rossi et al. | |
| 2003/0153108 A1* | 8/2003 | Durocher | H01L 23/13 438/26 |
| 2005/0132747 A1* | 6/2005 | Takemori | H01L 33/486 63/12 |
| 2006/0138495 A1* | 6/2006 | Li | H01L 27/14601 257/292 |
| 2009/0140361 A1* | 6/2009 | Jeong | H01L 27/14621 257/432 |
| 2009/0315131 A1* | 12/2009 | Hung | H01L 27/14621 257/432 |
| 2013/0011617 A1 | 1/2013 | Tasaki et al. | |
| 2013/0264586 A1* | 10/2013 | Rudmann | H01L 31/12 257/81 |

* cited by examiner

*Primary Examiner* — Angel Roman
(74) *Attorney, Agent, or Firm* — Fish & Richardson P.C.

(57) ABSTRACT

The disclosure describes light sensing optoelectronic modules that include reflective surfaces to enhance light collection and/or light emission. For example, an optoelectronic module can include a light sensing element mounted on a substrate. A spacer over the substrate has a through-hole over the light sensing element. The through-hole is defined by a surface that is at least partially sloped or curved with respect to a plane of the substrate. The surface is highly reflective for light detectable by the light sensing element. Various methods for fabricating the modules are described as well.

21 Claims, 11 Drawing Sheets

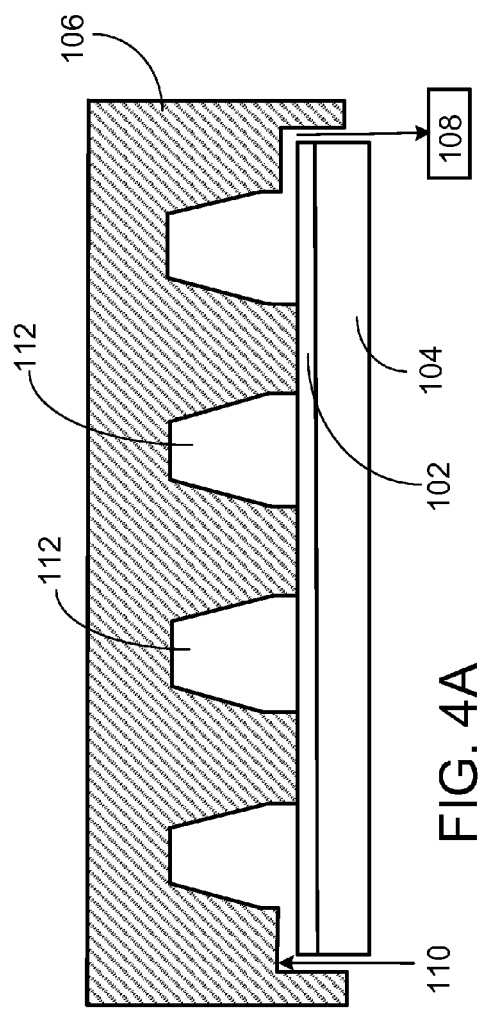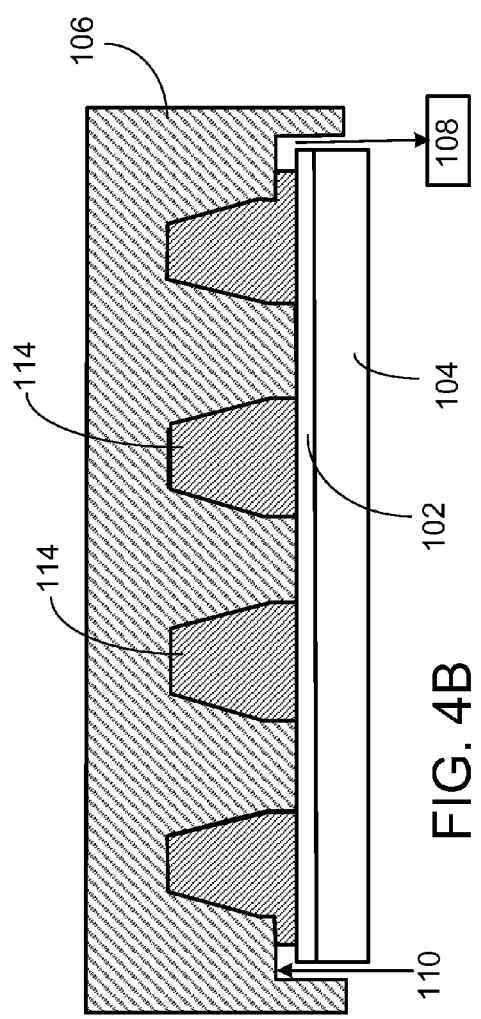

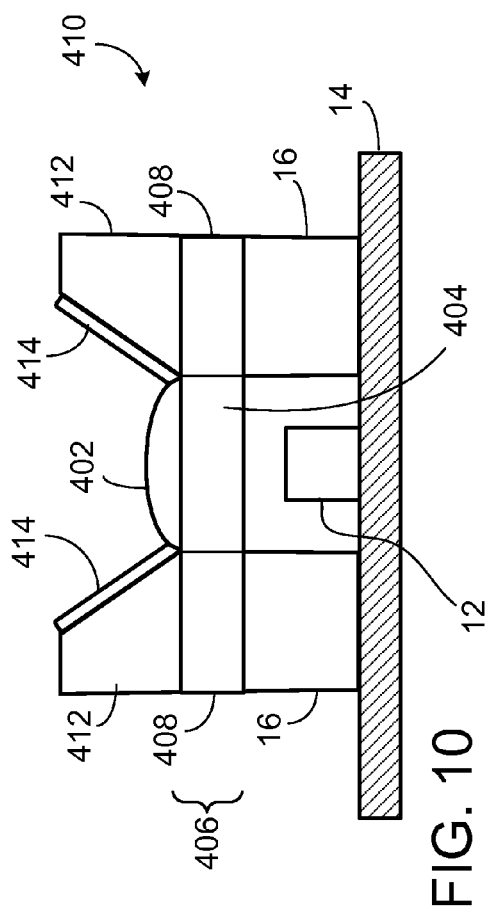
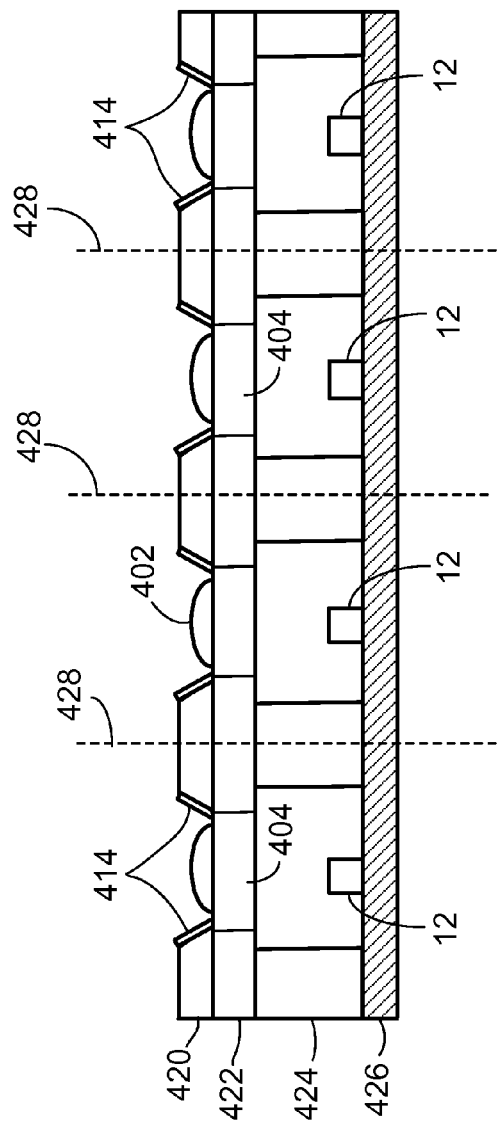

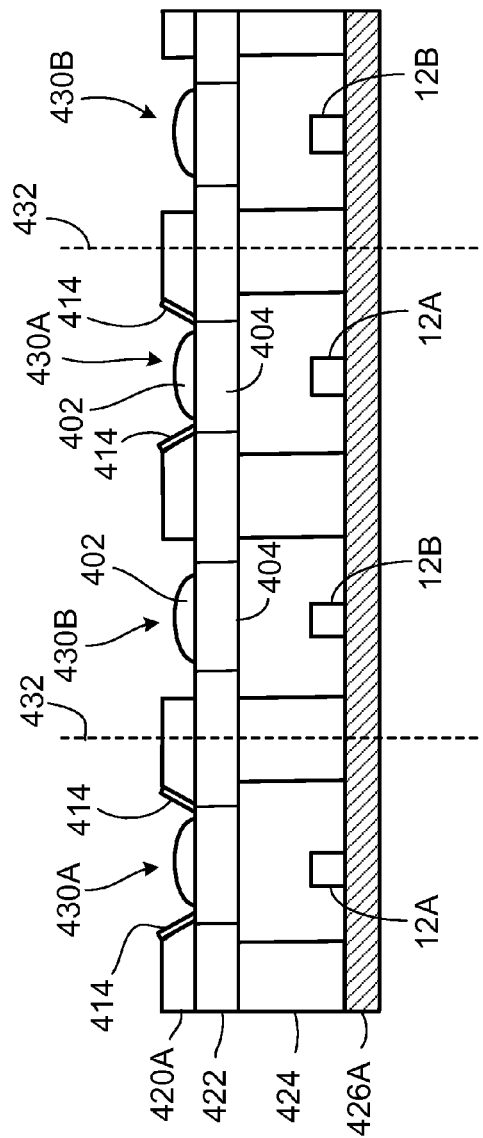
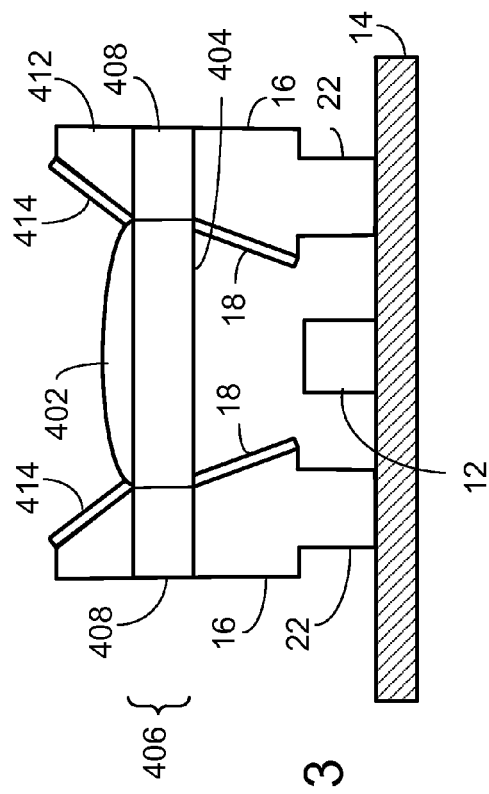

COMPACT LIGHT SENSING MODULES INCLUDING REFLECTIVE SURFACES TO ENHANCE LIGHT COLLECTION AND/OR EMISSION, AND METHODS OF FABRICATING SUCH MODULES

This application claims the benefit of priority of U.S. Provisional Patent Application No. 62/014,995, filed on Jun. 20, 2014. The contents of the earlier application are incorporated herein by reference in their entirety.

FIELD OF THE DISCLOSURE

This disclosure relates to compact light sensing modules that include reflective surfaces to enhance light collection and/or emission.

BACKGROUND

Various consumer electronic devices such as laptops and handheld or mobile computing devices (e.g., smartphones) include a light sensing module. Examples of such light sensing modules include ambient light sensors and proximity sensors. Space often is at a premium in the type of devices into which the module is to be integrated. Thus, it is desirable to provide light sensing modules that have good light collection capabilities, that are compact, and that can help reduce manufacturing costs. It also would be desirable to provide cost-effective techniques by which such modules can be mass produced.

SUMMARY

The disclosure describes light sensing optoelectronic modules that include reflective surfaces to enhance light collection and/or emission. Various methods for fabricating the modules are described as well.

For example, in one aspect, a method of fabricating a plurality of light sensing or light emitting modules in parallel includes providing a spacer structure having through-holes each of which is defined by a surface that is at least partially sloped or curved with respect to a plane of the spacer structure. The method includes applying a reflective coating to the at least partially sloped or curved surfaces and attaching the spacer structure to a substrate wafer on which are mounted a plurality of light sensing or light emitting elements, wherein each light sensing element or light emitting is aligned with a respective one of the through-holes.

Some implementations include one or more of the following features. For example, the reflective coating may comprise a metal and may be applied by sputtering or vapor deposition. The through-holes can be, for example, conical, at least partially parabolic or some other shape. The through-holes can be shaped to increase an amount of incoming light sensed by a corresponding light sensing element or to increase the amount of light emitted from the module. In some cases, the spacer structure is formed by vacuum injection and may include forming the spacer structure on a sacrificial substrate, and subsequently removing the sacricial substrate before attaching the spacer structure to the substrate wafer. In some instances, the spacer structure is formed by replication.

In accordance with another aspect, a method of fabricating, in parallel, a plurality of light sensing modules includes forming a stack of wafers disposed one on the other as follows: substrate wafer on which are mounted a plurality of light sensing elements; a spacer wafer having a respective through-hole over each light sensing element; an optics wafer including regions that are transparent to light detectable by the light sensing elements, wherein one of the transparent regions is present over each respective light sensing element, and wherein a beam shaping element is on each transparent region; and a baffle wafer having through-holes over the transparent regions, where each through-hole in the baffle wafer is defined by a respective surface having a reflective coating thereon.

In another aspect, an optoelectronic module includes a light sensing element mounted on a substrate. A spacer over the substrate has a through-hole over the light sensing element. The through-hole is defined by a surface that is at least partially sloped or curved with respect to a plane of the substrate. The surface is highly reflective for light detectable by the light sensing element.

In a further aspect, an optoelectronic module includes a light sensing element mounted on a substrate. A spacer over the substrate has a first through-hole over the light sensing element. An optics member is over the spacer and includes a transparent region over the through-hole in the spacer. A baffle is over the optics member and includes a second through-hole over the transparent region of the optics member. The second through-hole is defined by a surface that is highly reflective for light detectable by the light sensing element and that is at least partially sloped or curved with respect to a plane of the substrate.

Some implementations provide one or more of the following advantages. For example, in some implementations of light sensing modules, by providing a spacer whose inner walls are reflective or to which a reflective coating is applied, the lens assembly can be omitted. Such arrangements can help reduce the dimensions (i.e., height) and cost of the module, while still providing good light collection. Even in those implementations that include a lens assembly, the amount of incoming light sensed by the sensing element can be increased by providing a reflective surface on the inner surface of the spacer or on the inner surface of the baffle (if present), or on both. Likewise, the presence of a reflector over the light sensing element can help increase the amount of incoming light sensed by the sensing element and, in some cases, can reduce the visual impact of the light sensing element when the module is integrated, for example, into a consumer or other device. In some cases, the modules can be used, for example, as ambient light sensors or proximity sensors.

Other modules include a light emitting element and reflective features to enhance the amount of light emitted from the module. The reflective features can be particularly advantageous, for example, where the light emitting element is a non-directional light source such as a LED.

Other aspects, features and advantages will be apparent from the following detailed description, the accompanying drawings, and the claims.

BRIEF DESCRIPTION OF THE DRAWINGS

FIGS. 4A-4E illustrate steps in a wafer-level process for making light sensing modules.

FIG. 10 show an example of a light sensing module that includes a baffle having a reflective surface.

FIG. 11 is an example of a wafer stack for fabricating modules as in FIG. 10.

FIG. 12 is a wafer stack for fabricating modules that include both a light emission and a light detection channel.

FIG. 13 illustrates an example of a light sensing module that includes a spacer having a reflective coating and a baffle having a reflective coating.

DETAILED DESCRIPTION

Figure 1:
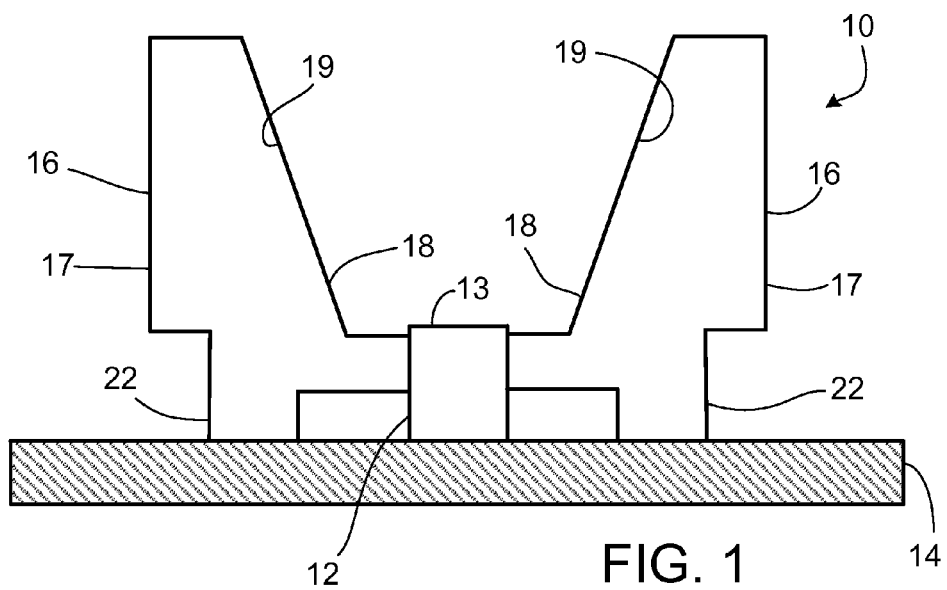
FIG. 1 shows an example of a light sensing module that includes a spacer having a reflective surface.

As illustrated in FIG. 1, an optoelectronic module 10 includes a light sensing element 12 (e.g., a CMOS or CCD image sensor or a photodiode) that is mounted on a printed circuit board (PCB) or other substrate 14. Electrical wiring or conductive pads can connect the light sensing element 12 to wiring or conductive pads on the surface of the substrate 14. The exterior surface of the substrate 14 may include solder balls or other conductive pads that allow the module 10 to be mounted, for example, to a PCB in a host device (e.g., a smartphone).

The module 10 includes a spacer 16 that provides a fixed separation between the photo sensitive surface 13 of the light sensing element 12 and a transparent window of the host device in which the module 10 is integrated. In some cases, the module may include a transparent cover over the spacer 16. In such cases, the spacer 16 provides a fixed separation between the photosensitive surface 13 of the light sensing element 12 and the transparent cover 16. The spacer 16 can be composed, for example, of a material that is substantially non-transparent to light detectable by the light sensing element 12 (e.g., infra-red (IR), ultra-violet (UV) or visible light). The outer surface 17 of the spacer 16 may be substantially perpendicular to the surface of the substrate 14 so as to serve as exterior sidewalls of the module. On the other hand, the inner surface 19 of the spacer 16 can be sloped or curved and may have a shape that is optimized to reflect incoming light toward the photo sensitive surface 13 even when the incoming light is received at low angles of incidence. To enhance the light collection characteristics of the module, the inner surface 19 of the spacer 16 should be highly reflective. In some implementations, the spacer 16 itself may be composed of a highly reflective material. Alternatively, or in addition, the inner surface 19 can be coated with a highly reflective material 18, such as a metal (e.g., aluminum, chromium or silver).

Figure 2:
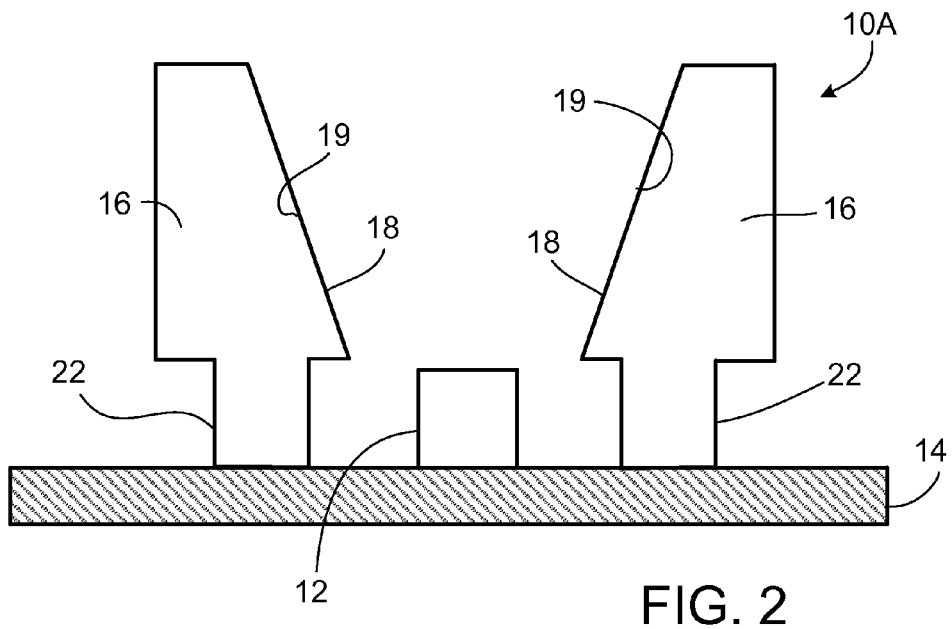
FIG. 2 shows another example of a light sensing module that includes a spacer having a reflective surface.

As shown in the example of FIG. 1, the inner surface 19 of the spacer 16 can be at least partially parabolic. The parabolic shape of the inner surface 19 can be designed such that the photo sensitive surface 13 of the light sensing element 12 is at (or at least very close to) the focal point of the parabola. In other implementations, it may be desirable to use a shape different from parabolic. For example, as shown in FIG. 2, the inner surface 19 of the spacer 16 may be conical, with the smaller end of the cone shape being closer to the light sensing element 12. Here too, the surface 19 may be coated with a highly reflective coating 18 (e.g., a metal such as aluminum, chromium or silver).

A stand-off 22 between the substrate 14 and the spacer 16 can provide room for the light sensing element 12. In some cases, the stand-off 22 is formed as separate components, and the substrate 14 can be attached to one side of the stand-off and the spacer 16 can be attached to the other side of the stand-off. In other implementations, the stand-off 22 is composed of the same material as, and are formed as a unitary piece with, the spacer 16. In any event, the stand-off 22 can be composed of a non-transparent material and can laterally surround the light sensing element 12.

If the shape and reflective characteristics of the inner surface 19 of the spacer 16 allow sufficient light to be detected by the light sensing element 12, then the need for a separate lens assembly can be obviated. The result can be a module that is less costly to manufacture and that has a relatively small height. In some instances, the inner diameter (d) of the stand-off 22 may be somewhat larger than the smallest inner diameter (D) of the spacer 16 (see FIG. 2). In other instances, the inner diameter (d) of the stand-off 22 may be about the same as the smallest inner diameter (D) of the spacer 16 (see FIG. 3).

Various techniques can be used to fabricate the foregoing modules. For example, wafer-level processes can be used in which many modules are fabricated simultaneously (i.e., in parallel). Generally, a wafer refers to a substantially disk- or plate-like shaped item, its extension in one direction (z-direction or vertical direction) is small with respect to its extension in the other two directions (x- and y-directions or lateral directions). On a (non-blank) wafer, a plurality of similar structures or items can be arranged, or provided therein, for example, on a rectangular grid. A wafer can have openings or holes, and in some cases a wafer may be free of material in a predominant portion of its lateral area. Depending on the implementation, a wafer may be made, for example, of a semiconductor material, a polymer material, a composite material comprising metals and polymers or polymers and glass materials. In particular, the wafers may comprise hard-enable materials such as a thermally or UV-curable polymers. In some implementations, the diameter of a wafer is between 5 cm and 40 cm, and can be, for example between 10 cm and 31 cm. The wafer may be cylindrical with a diameter, for example, of 2, 4, 6, 8 or 12 inches, one inch being about 2.54 cm. The wafer thickness can be, for example, between 0.2 mm and 10 mm, and in some cases, is between 0.4 mm and 6 mm.

Figure 3:
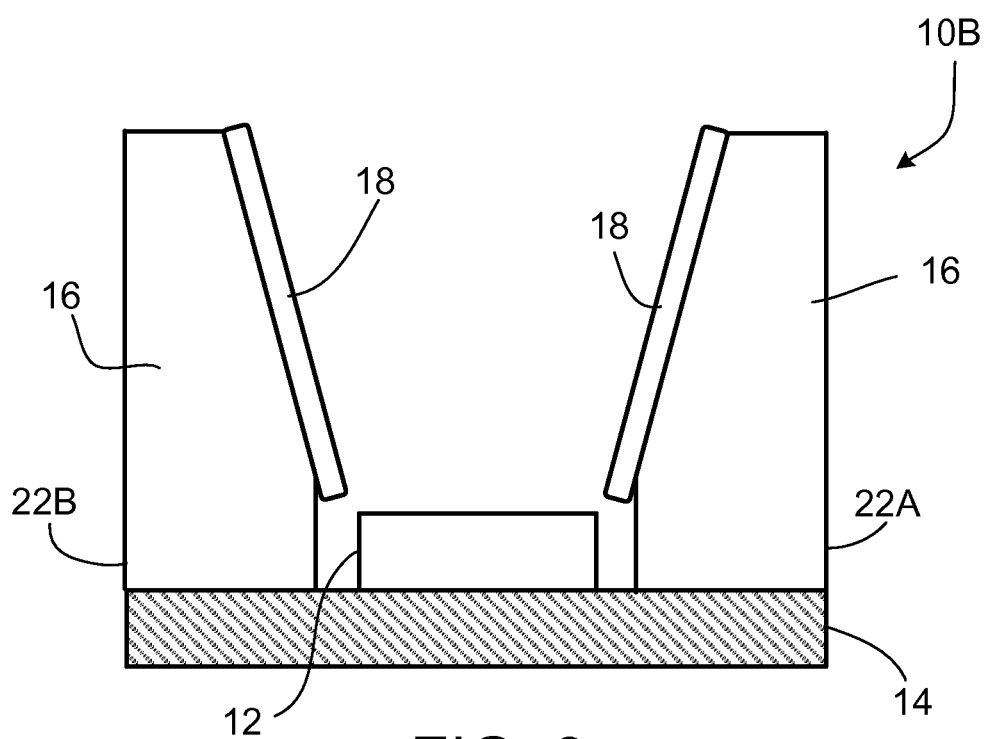
FIG. 3 shows yet a further example of a light sensing module that includes a spacer having a reflective surface.
Figure 4C:
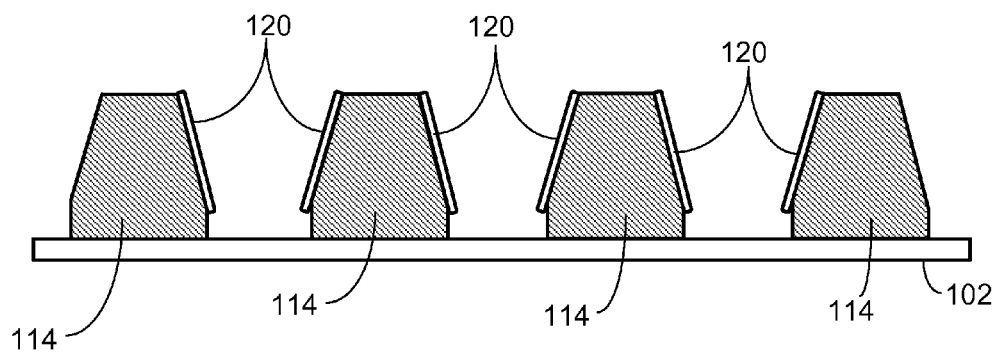

FIGS. 4A-4E illustrate steps in a wafer-level process for making modules 10B as shown in FIG. 3. Similar techniques can be used to make modules as shown in FIGS. 1 and 2. As illustrated in FIG. 4A, a sacrificial substrate 102 is placed on a support such as a vacuum chuck 104. A polydimethylsiloxane (PDMS) tool 106 then is brought into contact with the opposite surface of the sacrificial substrate. The PDMS tool 106 defines spaces 112 which subsequently are filled, for example, with a UV- and/or thermally curable material 114 such an epoxy or polymer-based material that, when cured, is substantially non-transparent to light detectable by the light sensing element 12 (see FIG. 3B). The shape of the spaces 114 corresponds generally to the shape of the spacers and stand-offs. The spaces 112 can be filled, for example, by a vacuum injection technique, in which material is injected into an inlet 110. A pump 108 near an outlet of the tool 106 can facilitate the vacuum injection process. After curing the vacuum injected material, the vacuum chuck 104 and tool 106 can be removed.

Figure 4D:
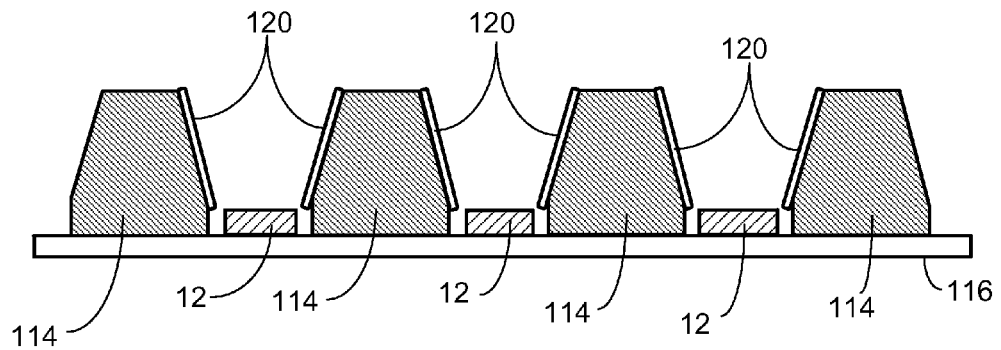
Figure 4E:
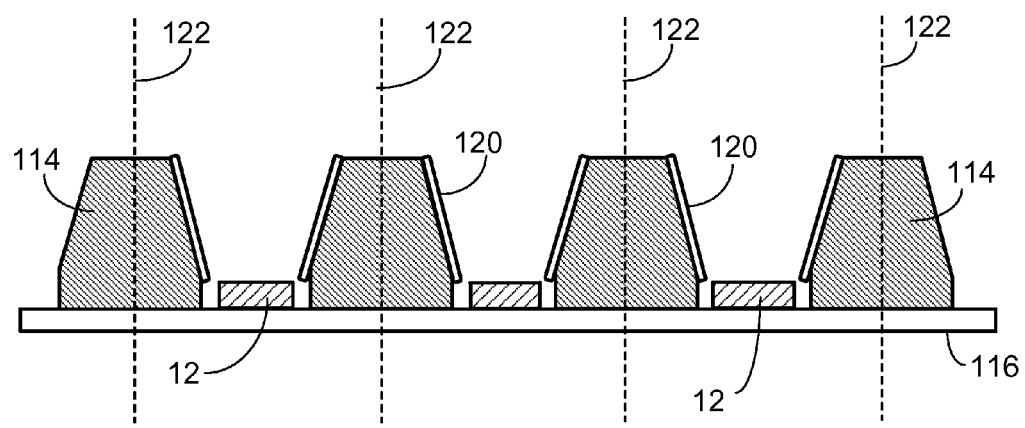

Next, as shown in FIG. 4C, a metal coating 120, for example, can be applied to the inner surfaces of the vacuum injected material 114 for the spacer regions. The metal coating 120 can be applied, for example, by sputtering or vapor deposition. Then, the vacuum injected structure 118 can be removed from the sacrificial substrate 102 and attached (e.g., by adhesive) to a PCB or other support wafer 116 (FIG. 4D). The surface of the PCB wafer 116 to which the structure 118 is attached includes an array of light sensing elements 12. The light sensing elements 12 are separated laterally from one another such that when the vacuum injected structure 118 is attached to the PCB wafer 116, each light sensing element 12 is surrounded laterally by a portion of the vacuum injected structure. The resulting structure then can be separated (e.g., by dicing) along lines 122 into individual modules (see FIG. 4E). In some implementations, the order of at least some of the foregoing steps may vary.

In some implementations, instead of using a vacuum injection technique to form the spacer/stand-off features, a replication technique can be used. For example, a PDMS or other tool that includes a negative array or grid of the spacer/stand-off features can be provided. Next, a moldable, curable material (e.g., a UV and/or thermally-curable epoxy material) is applied onto the surface of the tool on the spacer/stand-off features, and a glass or other substrate is pressed into the moldable, curable material. After curing the material, the glass substrate is removed from the resulting molded spacer/stand-off structure. The molded spacer/stand-off structure then can be attached to a PCB wafer with light sensing elements mounted on its surface, and a reflective coating can be applied to inner surfaces of spacer features. The resulting structure than can be diced into individual modules as described above.

Another approach for forming the spacer/stand-off structure as part of a wafer-level process starts involved mechanically drilling, or chemically etching, openings in a wafer of a material that is substantially opaque (i.e., not transparent) to wavelengths of light sensed by the light sensing element 12 (e.g., a PCB wafer composed of FR4, which is a grade designation assigned to glass-reinforced epoxy laminate material). Mechanical drilling can be used, for example, to form parabolic, conical, or other-shaped openings in the wafer so as to define the spacer regions and to define the spaces for the light sensing elements. The resulting spacer/stand-off structure can be attached to another wafer (e.g., PCB wafer) with light sensing elements mounted on its surface, and a reflective coating (e.g., metal) can be applied to inner surfaces of spacer features. The resulting structure than can be diced into individual modules as described above.

Figure 5A:
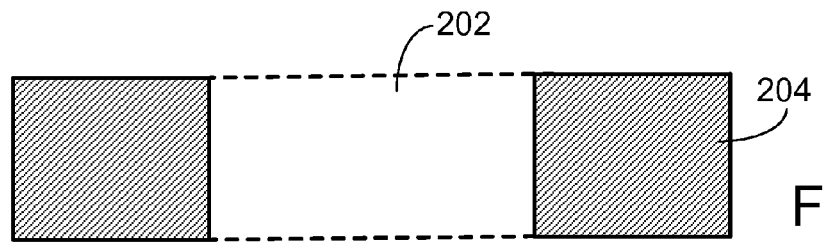
FIGS. 5A-5D illustrate steps for forming a spacer/stand-off structure as part of a wafer-level process.
Figure 5B:
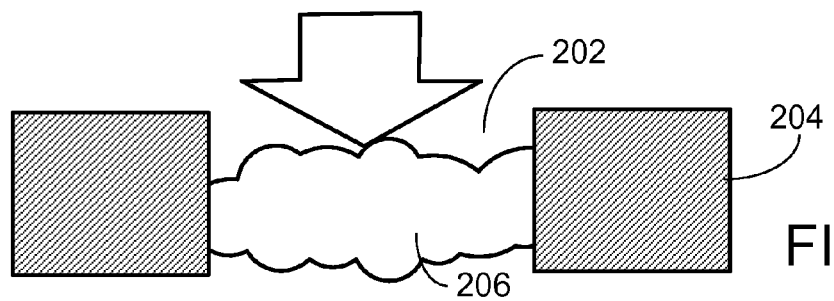
Figure 5C:
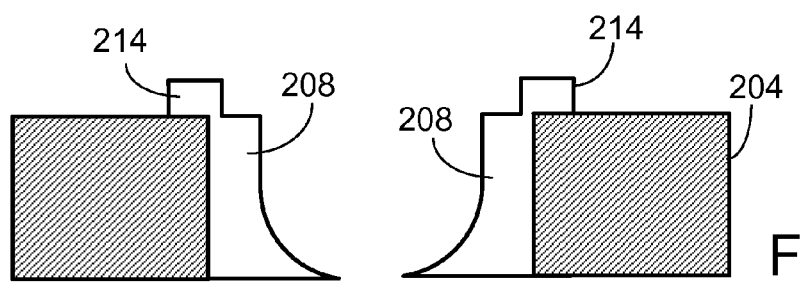
Figure 5D:
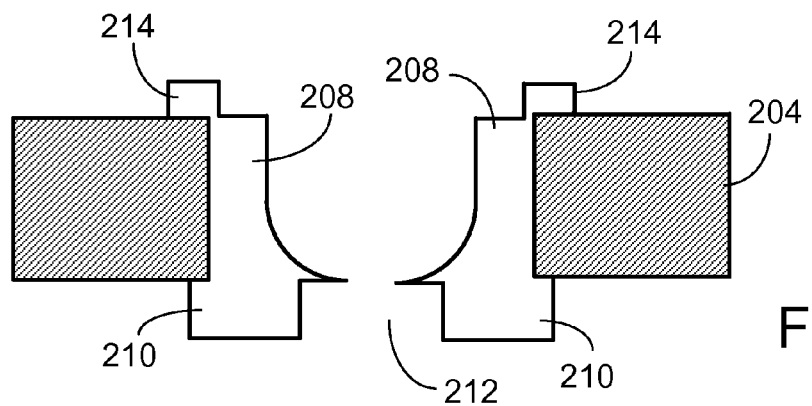

Yet a further approach for forming the spacer/stand-off structure as part of a wafer-level process involves drilling or otherwise providing openings (e.g., cylindrical through-holes) 202 through a PCB or other wafer 204 of suitable material (see FIG. 5A). The through-holes, which define replication sites, then are partially filled with a plastically deformable, or viscous material 206 that can be cured, for example, by UV radiation and/or heat (see FIG. 5B). Replication material can be dispensed from one or more dispensing units that are guided over the surface of the wafer to the replication sites. Further details are described in U.S. Pat. No. 8,643,953, which is incorporated herein by reference. As indicated by the arrow in FIG. 5B, a first replication tool that includes a negative array or grid of the spacer features can be pressed into the moldable material present in the openings so as to form the spacer features. The first tool can be used to form spacer regions 208 that have parabolic, conical or other specified shapes along their inner surfaces (see, e.g., FIG. 5C). The peripheral portion of the spacer region 208 can extend along the entire circumferential surface of the through-hole 202. A second replication tool can be pressed onto additional dispensed moldable material from the opposite side of the wafer 204 so as to define stand-off features 210 and openings 212 for the light sensing elements (see FIG. 5D). The molded material may form a yard 214 that extends slightly over the upper surface of the PCB wafer 204 to enhance mechanical stability. After pressing each tool into the replication material, the molded material then can be hardened (e.g., by UV or thermal curing).

In some cases, a reflective coating may be applied to the inner surfaces 214 of the spacer features 210 to increase their reflectivity. If, however, the material used to form the spacer regions 210 is sufficiently reflective, it may be unnecessary to add a separate reflective coating. The resulting spacer/stand-off structure can be attached to a PCB wafer with light sensing elements mounted on its surface, and a reflective coating can be applied to inner surfaces of spacer features. The resulting structure then can be diced into individual modules as described above.

Figure 6:
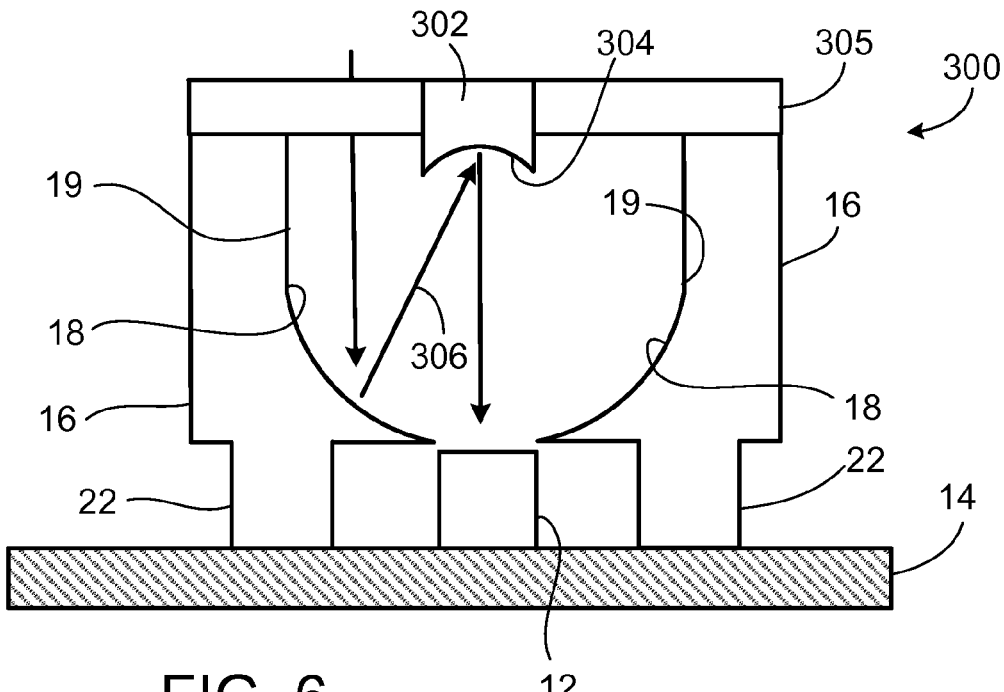
FIG. 6 illustrates an example of a module that includes an additional reflector over the light sensing element.

Some implementations can include an additional reflective surface over the light sensing element 12 to enhance the collection of incoming light even further. An example is illustrated in FIG. 6, which shows a light sensing module 300 similar to the module of FIG. 1, but with the addition of a reflector 302 over the light sensing element 12 at an object-side of the module. The illustrated module 300 includes two reflective parabolic surfaces. A first reflective parabolic surface 18, 19 reflects i) a portion of the incident light that is not parallel to the axis of symmetry of the first reflective parabolic surface 18, 19 toward the light sensing element 12 and ii) incident light that is parallel to the axis of symmetry of the first reflective parabolic surface 18, 19 to the second reflective parabolic surface 304. The second reflective parabolic surface 304 is positioned at, or near, the focal point of the first reflective parabolic surface 18, 19 and reflects light toward the light sensing element 12, which is positioned at, or near, the focal point of the first reflective parabolic surface 18, 19. In some cases, the surface 304 of the reflector 302 may be substantially flat or have a shape other than parabolic. Further, a reflector 302 over the light sensing element 12 also can be provided regardless of the shape of the inner surface 19 of the spacer 16. Thus, a reflector 302 can be provided, for example, in the implementations of FIGS. 2 and 3. The addition of the reflector 302, which can be attached to, or embedded within, a transparent cover 305, can increase the amount of incoming light directed toward the light sensing element 12 without the need to use a lens assembly and while still allowing incoming light at a low angle of incidence to be received by the light sensing element 12. Modules that include the foregoing features can, in some implementations, have good light collection capabilities, as well as a relatively small overall height. In some instances, such modules also can be made at a lower cost relative to modules that include a lens assembly. Further, the presence of the reflector over the light sensing element can, in some cases, reduce the visual impact of the light sensing element when the module is integrated, for example, into electronic device such as a smartphone. This feature may enhance the aesthetic appearance of the smartphone or other device.

Figure 7:
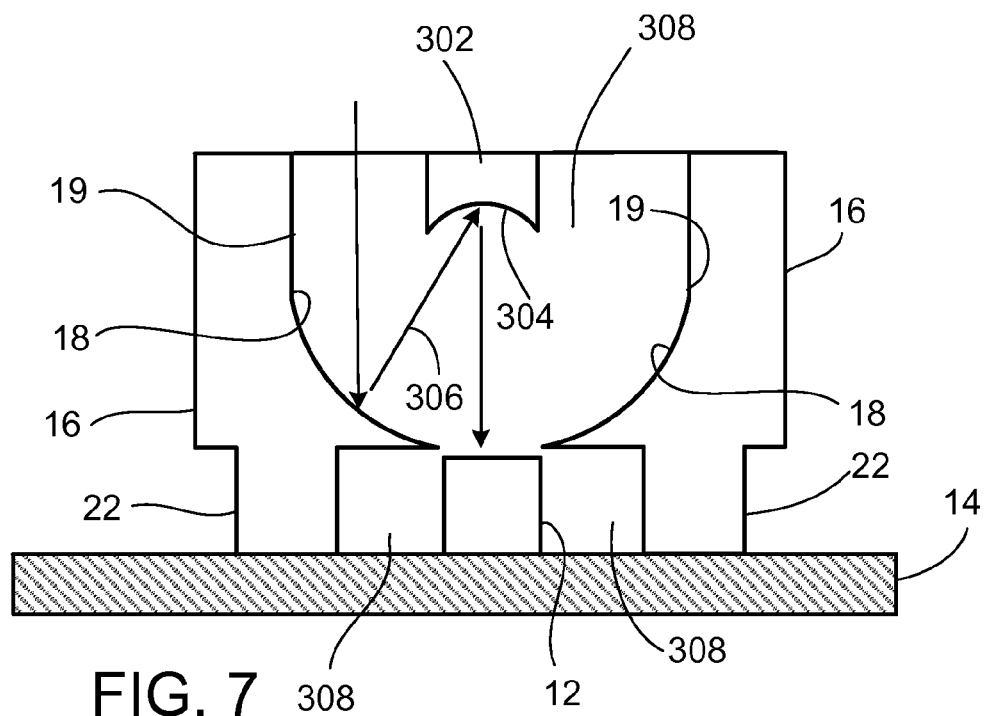
FIG. 7 illustrates another example of a module that includes a reflector over the light sensing element.

In some cases, as illustrated in FIG. 7, the cavity defined by the parabolic (or other-shaped) opening can be back-filled, for example, with an epoxy material 308 that is transparent to wavelengths of light to be sensed by the sensing element 12. Filling the cavity in this manner can obviate the need for a transparent cover 305 to hold the reflector 302. Instead, the reflector 302 can be inserted into the transparent epoxy material 308 prior to curing the epoxy. The epoxy backfill 308 also may be advantageous in protecting the underlying components. For example, it can help protect the reflective surface(s) from oxidizing or becoming tarnished.

Figure 8:
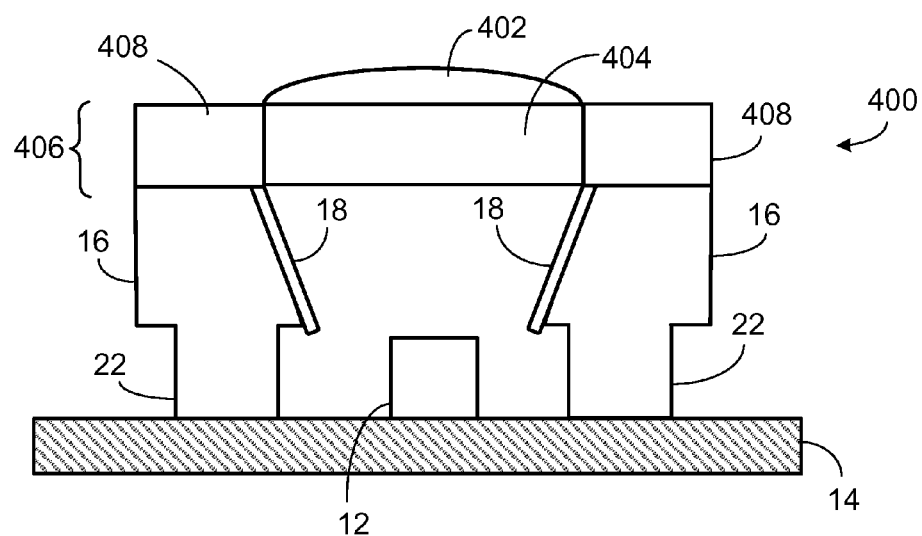
FIG. 8 shows another example of a light sensing module that includes a spacer having a reflective surface.

Although providing a spacer with a reflective surface can, in some implementations, obviate the need for a separate lens or lens assembly, nevertheless, in some cases, a spacer having a reflective surface can be combined in a module that includes a lens or lens assembly. FIG. 8 illustrates an example of such a module 400, which includes a reflective coating 18 on the inner surface of the spacer 16, as well as a lens 402 on a surface of a transparent cover 404. The transparent cover 404, which is disposed over the light sensing element 12, can form part of an optics member 406 that includes, for example, non-transparent material 408 laterally surrounding the transparent cover. The spacer 16 separates the optics member 406 from the substrate 14 on which the light sensing element 12 is mounted. An optics wafer can be fabricated, for example, by forming through-holes in a PCB or other non-transparent wafer, filling the through-holes with a curable, transparent epoxy material, and replicating a lens on the hardened (i.e., cured) epoxy material. The optics wafer then can be attached (e.g., by adhesive) to a spacer wafer as part of a wafer-level process for fabricating multiple modules 400 in parallel.

Figure 9:
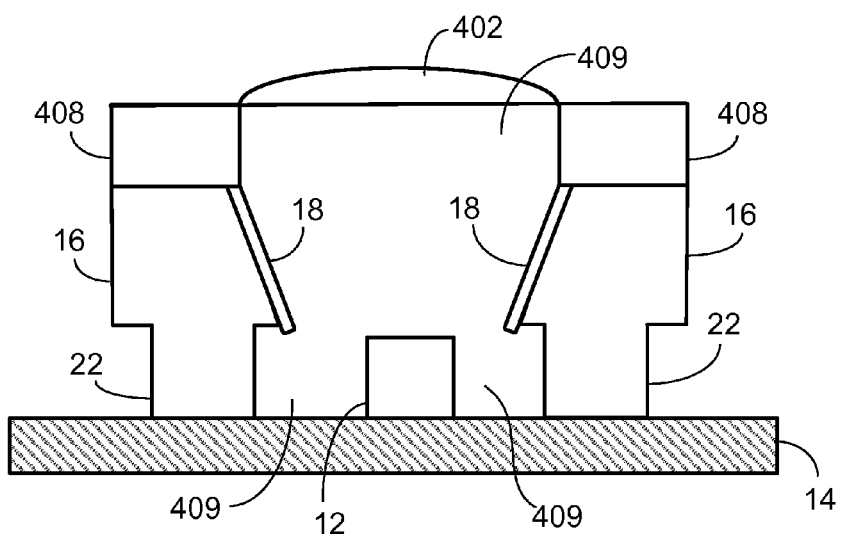
FIG. 9 shows another example of a light sensing module that includes a spacer having a reflective surface.

In some implementations, as illustrated in FIG. 9, the cavity defined by the conical (or other-shaped) opening can be back-filled, for example, with an epoxy material 409 that is transparent to wavelengths of light to be sensed by the sensing element 12. Filling the cavity in this manner can obviate the need for a transparent cover 404 on which the lens 402 is formed. Instead, the lens 402 can be formed directly on the transparent epoxy material 409 at an object-side of the module. As explained above, the epoxy backfill 409 also may be advantageous in protecting the underlying components. For example, it may help protect the reflective surface(s) from oxidizing or becoming tarnished.

Some modules include a baffle, which functions to shield the light sensing element(s) in the module from light coming from sources outside the intended field of view (FOV) for the module. The baffle can be attached, for example, over an optics member that includes a lens or other beam shaping element. The walls of the baffle are designed to block at least some of the light that is outside the intended FOV of the module, thereby reducing the intensity of light that is reflected by the module's walls. As described in greater detail below, the inner surfaces of the baffle can be coated with a reflective material (e.g., a metal such as aluminum, chromium or silver) to increase the amount of incoming light that is reflected by the baffle's inner walls and detected by the light sensing element. FIGS. 10-13 illustrate particular examples.

FIG. 10, for example, illustrates a module 410 that includes a baffle 412 disposed over an optics member 406. The inner surface 414 of the baffle 412 can be shaped to enhance the collection of incoming light and can be coated with a reflective material such as a metal. In the illustrated example of FIG. 10 the inner surface 414 of the baffle 412 defines a conical through-hole with the walls sloping inwardly toward the lens 402. In other implementations, the inner surface 414 of the baffle 412 can define a through-hole having a different shape (e.g., parabolic). As illustrated by FIG. 11, such modules can be manufactured as part of a wafer-level process, which includes attaching multiple wafers to one another to form a vertical stack. In particular, the wafer stack can include, for example, the following wafers in this order (from top to bottom): a baffle wafer 420 (including reflective surfaces 414), an optics wafer 422, a spacer wafer 424, and a PCB or other substrate wafer 426 on which are mounted light sensing elements 12. After forming the wafer stack, the stack can be separated (e.g., by dicing) along lines 428 to form multiple individual modules 410. The chronological order in which the wafers are stacked can vary. Thus, for example, in some cases, the wafers may be stacked from top to bottom, starting with the baffle wafer, whereas in other cases, the wafers may be stacked from bottom to top, starting with the PCB wafer. Other implementations may stack the wafers in a different order (e.g., the spacer wafer may be attached to the PCB wafer, the baffle wafer may be attached to the optics wafer, and then the partial stacks may be attached together).

A similar technique can be used to form modules that include both side-by-side light emitting and light sensing channels. In this case, as shown in FIG. 12, the wafer stack includes a PCB or other substrate wafer 426A that includes a light emitting element (e.g., a LED, a laser diode, or an OLED) 12B adjacent each light sensing element 12A. Further, a baffle wafer 420A includes through-holes 430A, 430B. Through-holes 430A positioned above the emission channel may have, for example, substantially vertical walls, whereas through-holes 430B positioned above the detection channel can have walls shaped to enhance light collection by the light sensing element 12 and can be coated with a reflective layer (e.g., a metal coating). The wafer stack of FIG. 12 can be diced along lines 432 to form multiple modules, each of which includes a light emitting element adjacent a light sensing element. Such modules may be useful, for example, as proximity sensors in smartphones or other mobile or handheld electronic devices (e.g., laptop computers, tablets).

Some implementations may include a reflective coating on the inner surface 18 of the spacer as well as a reflective coating 414 on the inner surface of the baffle. FIG. 13 illustrates an example. Although the illustrated example shows both the spacer and baffle as having conical inner surfaces, they may have other shapes as well. Further, the inner surface of the spacer may have a different shape from that of the baffle.

Figure 14:
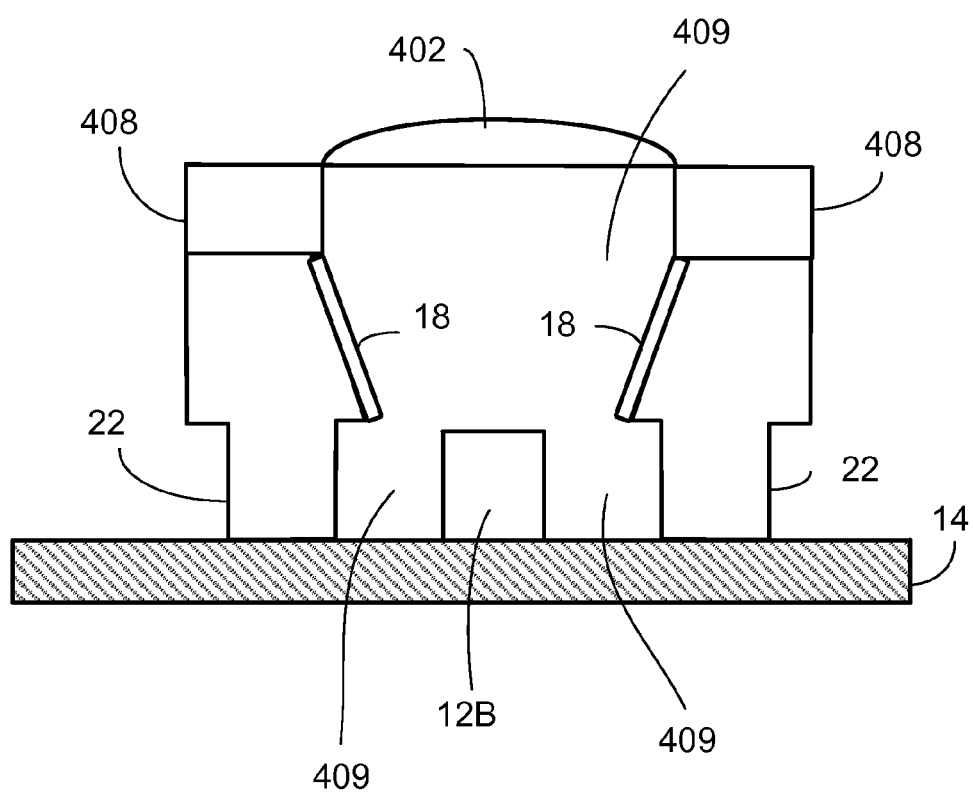
FIG. 14 illustrates an example of a light emitting module that includes reflective surfaces to enhance light emission.

Although the foregoing example modules include one or more reflective surfaces to enhance the amount of light sensed by a light sensing element 12 (or 12A) in the module, similar reflective surfaces can be provided to enhance light emission from the module. For example, the types of reflective surfaces described above can be used to increase the amount of light from a non-directional light source (e.g., a LED) that is emitted from the module. In such cases, the light sensing element can be replaced by a light emitting element such as an LED. An example of such a light emitting module is illustrated in FIG. 14 and includes a light emitting element 12B and reflective surfaces 18. The light sensing element in the other implementations described above also can be replaced by a light emitting element to obtain a light emitting module. Further, techniques similar to the one described in connection with FIGS. 4A-4E can be used to fabricate multiple light emitting modules in parallel as part of a wafer-level process.

Various modification can be made to the particular implementations described above. Accordingly, other implementations are within the scope of the claims.

What is claimed is:
1. A method of fabricating, in parallel, a plurality of light sensing or light emitting modules, the method comprising:
provding a spacer structure having through-holes each of which is defined by a surface that is at least partially sloped or curved with respect to a plane of the spacer structure, wherein the spacer structure is formed by vacuum injection;

applying a reflective coating to the at least partially sloped or curved surfaces; and attaching the spacer structure to a substrate wafer on which are mounted a plurality of light sensing or light emitting elements, wherein each light sensing or light emitting element is aligned with a respective one of the through-holes.

2. The method of claim 1 wherein the reflective coating comprises a metal.

3. The method of claim 2 wherein the reflective coating is applied by sputtering or vapor deposition.

4. The method of claim 1 wherein each of the through-holes is conical.

5. The method of claim 1 wherein each of the through-holes is at least partially parabolic.

6. The method of claim 1 wherein each of the through-holes is shaped to increase an amount of incoming light sensed by a corresponding light sensing element mounted on the substrate wafer.

7. The method of claim 1 further including:
after attaching the spacer structure to the substrate wafer to form a stack, separating the stack into a plurality of light sensing or light emitting modules.

8. The method of claim 1 including forming the spacer structure on a sacrificial substrate, and subsequently removing the sacricial substrate before attaching the spacer structure to the substrate wafer.

9. A method of fabricating, in parallel, a plurality of light sensing or light emitting modules, the method comprising:
forming a spacer structure on a sacrificial substrate by replication, the spacer structure having through-holes each of which is defined by a surface that is at least partially sloped or curved with respect to a plane of the spacer structure;

applying a reflective coating to the at least partially sloped or curved surfaces;

removing the spacer structure from the sacrificial substrate; and attaching the spacer structure to a substrate wafer on which are mounted a plurality of light sensing or light emitting elements, wherein each light sensing or light emitting element is aligned with a respective one of the through-holes.

10. A method of fabricating, in parallel, a plurality of light sensing or light emitting modules, the method comprising:
providing a spacer structure having through-holes each of which is defined by a surface that is at least partially sloped or curved with respect to a plane of the spacer structure, wherein providing the spacer structure includes:
forming through-holes in a spacer wafer, wherein the through-holes define replication sites;
dispensing replication material into the replication sites; and pressing a replication tool into the replication material so that the replication material defines the at least partially sloped or curved surfaces;

the method further including:
applying a reflective coating to the at least partially sloped or curved surfaces; and attaching the spacer structure to a substrate wafer on which are mounted a plurality of light sensing or light emitting elements, wherein each light sensing or light emitting element is aligned with a respective one of the through-holes.

11. A method of fabricating, in parallel, a plurality of light sensing modules, the method comprising:
forming a stack of wafers disposed one on the other as follows:
a substrate wafer on which are mounted a plurality of light sensing elements;
a spacer wafer having a respective through-hole over each light sensing element;
an optics wafer including regions that are transparent to light detectable by the light sensing elements, wherein one of the transparent regions is present over each respective light sensing element, and wherein a beam shaping element is on each transparent region; and
a baffle wafer having through-holes over the transparent regions, where each through-hole in the baffle wafer is defined by a respective surface having a reflective coating thereon.

12. The method of claim 11 further including separating the stack to form multiple individual modules.

13. The method of claim 11, wherein the reflective coating comprises a metal.

14. The method of claim 13 wherein the reflective coating is applied by sputtering or vapor deposition.

15. The method of claim 11, wherein the through-holes in the baffle-wafer are conical.

16. The method of claim 10, wherein the through-holes in the baffle-wafer are at least partially parabolic.

17. The method of claim 10 wherein the reflective coating comprises a metal.

18. The method of claim 17 wherein the reflective coating is applied by sputtering or vapor deposition.

19. The method of claim 10 wherein each of the through-holes is conical.

20. The method of claim 10 wherein each of the through-holes is at least partially parabolic.

21. The method of claim 10 further including:
after attaching the spacer structure to the substrate wafer to form a stack, separating the stack into a plurality of light sensing or light emitting modules.

* * * * *